US011404558B2

(12) United States Patent
Chiou et al.

(10) Patent No.: US 11,404,558 B2
(45) Date of Patent: Aug. 2, 2022

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Yao-De Chiou, Zhongli (TW); Hui-Chi Chen, Zhudong Township (TW); Jeng-Ya Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 175 days.

(21) Appl. No.: 16/841,727

(22) Filed: Apr. 7, 2020

(65) Prior Publication Data

US 2020/0235225 A1 Jul. 23, 2020

Related U.S. Application Data

(60) Continuation of application No. 16/195,102, filed on Nov. 19, 2018, now Pat. No. 10,651,289, which is a
(Continued)

(51) Int. Cl.
*H01L 29/78* (2006.01)
*H01L 29/66* (2006.01)
(Continued)

(52) U.S. Cl.
CPC ......... *H01L 29/66545* (2013.01); *H01L 21/823437* (2013.01); *H01L 21/823842* (2013.01);
(Continued)

(58) Field of Classification Search
None
See application file for complete search history.

(56) References Cited

U.S. PATENT DOCUMENTS 6,812,106 B1   11/2004   Xiang et al.
8,748,302 B2    6/2014   Prindle et al.
(Continued)

FOREIGN PATENT DOCUMENTS

DE   102012205298 A1   8/2013
JP   2007-129038 A     5/2007
(Continued)

OTHER PUBLICATIONS

Office Action issued in corresponding Taiwanese Patent Application No. 105125400, dated Sep. 29, 2017.
(Continued)

*Primary Examiner* — Joseph C. Nicely
*Assistant Examiner* — Lamont B Koo
(74) *Attorney, Agent, or Firm* — McDermott Will & Emery LLP

(57) ABSTRACT

A semiconductor device includes a first field effect transistor (FET) including a first gate dielectric layer and a first gate electrode. The first gate electrode includes a first lower metal layer and a first upper metal layer. The first lower metal layer includes a first underlying metal layer in contact with the first gate dielectric layer and a first bulk metal layer. A bottom of the first upper metal layer is in contact with an upper surface of the first underlying metal layer and an upper surface of the first bulk metal layer.

20 Claims, 7 Drawing Sheets

Related U.S. Application Data division of application No. 15/063,346, filed on Mar. 7, 2016, now Pat. No. 10,134,872.

(60) Provisional application No. 62/272,031, filed on Dec. 28, 2015.

(51) Int. Cl.
*H01L 29/49* (2006.01)
*H01L 21/8234* (2006.01)
*H01L 21/8238* (2006.01)

(52) U.S. Cl.
CPC ...... *H01L 29/4958* (2013.01); *H01L 29/4966* (2013.01); *H01L 29/66795* (2013.01); *H01L 29/785* (2013.01); *H01L 21/823431* (2013.01)

(56) References Cited

U.S. PATENT DOCUMENTS

| | | | |
|---|---|---|---|
| 10,134,872 B2 | 11/2018 | Chiou et al. | |
| 2011/0147858 A1 | 6/2011 | Lim et al. | |
| 2012/0056245 A1* | 3/2012 | Kang | H01L 29/66628 257/192 |
| 2012/0273848 A1* | 11/2012 | Fan | H01L 29/41775 257/288 |
| 2013/0309856 A1 | 11/2013 | Jagannathan et al. | |
| 2014/0199837 A1* | 7/2014 | Hung | H01L 23/485 438/675 |
| 2014/0306317 A1 | 10/2014 | Licausi | |
| 2014/0367801 A1 | 12/2014 | Liu et al. | |
| 2015/0021672 A1 | 1/2015 | Chuang et al. | |
| 2015/0061027 A1* | 3/2015 | Hong | H01L 27/0922 257/369 |
| 2015/0145057 A1 | 5/2015 | Fan et al. | |
| 2015/0228746 A1 | 8/2015 | Chiang et al. | |
| 2016/0104788 A1 | 4/2016 | Ryu et al. | |
| 2016/0149015 A1* | 5/2016 | Cai | H01L 21/3083 257/401 |
| 2016/0163603 A1* | 6/2016 | Bao | H01L 21/28167 257/412 |
| 2017/0133219 A1 | 5/2017 | Tak et al. | |

FOREIGN PATENT DOCUMENTS

| | | |
|---|---|---|
| JP | 2011-129929 A | 6/2011 |
| JP | 2013-012686 A | 1/2013 |

OTHER PUBLICATIONS

Office Action issued in corresponding Korean Patent Application No. 10-2016-0135536, dated Oct. 26, 2017.
Notice of Allowance issued in parent U.S. Appl. No. 15/063,346, dated Jul. 16, 2018.
Non-Final office issued in parent U.S. Appl. No. 15/063,346, dated Dec. 29, 2017.
Final Office Action issued in parent U.S. Appl. No. 15/063,346, dated Feb. 23, 2017.
Non-Final Office Action issued in parent U.S. Appl. No. 15/063,346, dated Oct. 7, 2016.
Non-Final Office Action issued in parent U.S. Appl. No. 15/063,346, dated Jun. 17, 2016.
Office Action issued in corresponding Korean Patent Application No. 10-2016-0135536, dated Jan. 22, 2019.
Non-Final Office Action issued in U.S. Appl. No. 16/049,545, dated Jun. 24, 2019.
Non-Final Office Action issued in U.S. Appl. No. 16/195,102, dated Aug. 7, 2019.
Notice of Allowance issued in U.S. Appl. No. 16/195,102, dated Jan. 8, 2020.

* cited by examiner

SEMICONDUCTOR DEVICE AND A METHOD FOR FABRICATING THE SAME

CROSS-REFERENCE TO RELATED APPLICATIONS

This application is a continuation application of U.S. patent application Ser. No. 16/195,102 filed on Nov. 19, 2018, which is a divisional application of U.S. patent application Ser. No. 15/063,346, filed on Mar. 7, 2016, now U.S. Pat. No. 10,134,872, which claims the benefit of priority to U.S. Provisional Patent Application 62/272,031 filed Dec. 28, 2015, the entire disclosures of each of which are incorporated herein by reference.

TECHNICAL FIELD

The disclosure relates to a method for manufacturing a semiconductor device, and more particularly to a structure and a manufacturing method for a metal gate structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1A-12 show exemplary sequential manufacturing process of a semiconductor device according to one embodiment of the present disclosure. FIGS. 1B-12 are cross sectional views corresponding to line X1-X1 of FIG. 1A. It is understood that additional operations can be provided before, during, and after processes shown by FIGS. 1A-12, and some of the operations described below can be replaced or eliminated for additional embodiments of the method. The order of the operations/processes may be interchangeable.

Figure 1A:
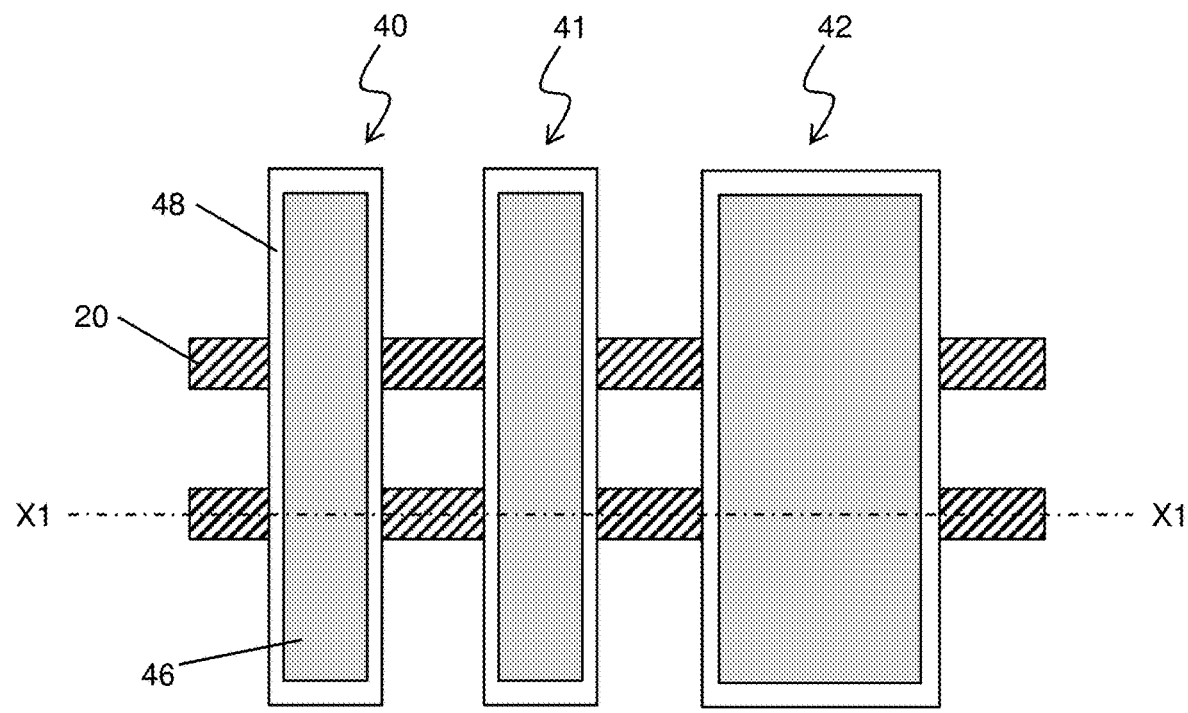
FIG. 1A shows a top view (plan view) and FIG. 1B shows a cross sectional view of one of the various stages of a sequential manufacturing process for a semiconductor device according to an embodiment of the present disclosure.
Figure 1B:
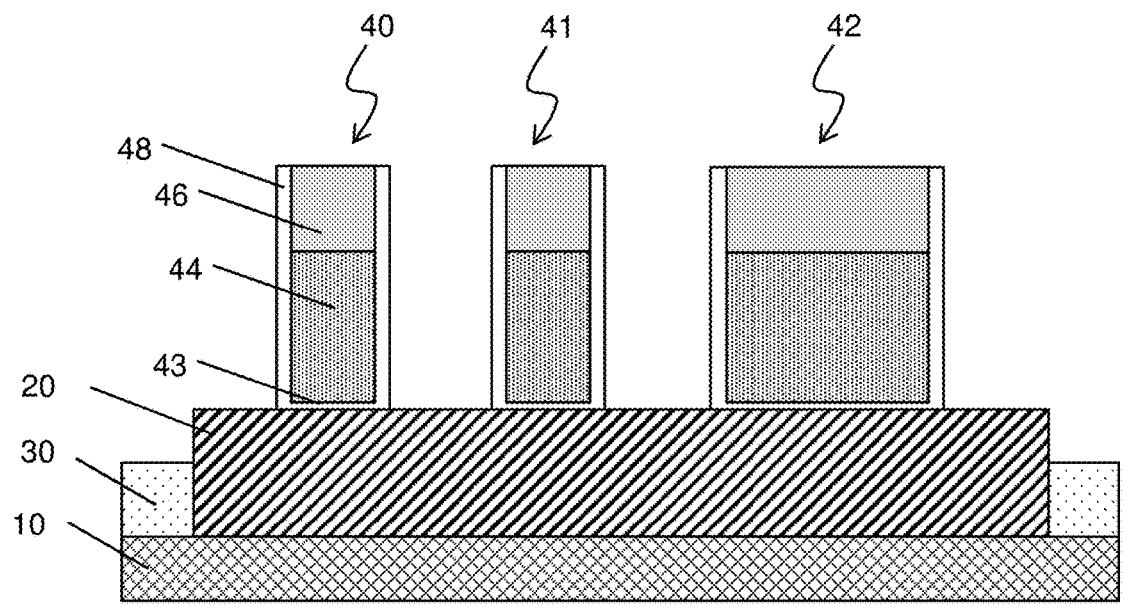

FIG. 1A shows a top view (plan view) of a structure of a semiconductor device after dummy gate structures are formed over a substrate. In FIGS. 1A and 1B, dummy gate structures 40, 41 and 42 are formed over a channel layer, for example, a part of a fin structure 20. Each of the dummy gate structures 40, 41 and 42 corresponds to an n-channel FET, a p-channel FET and an n-type long channel FET.

The fin structure 20 is formed over a substrate 10 and extends from an isolation insulating layer 30. For explanation purpose, the dummy gate structures 40, 41 and 42 are formed over the same fin structure 20, but in some embodiments, dummy gate structures 40, 41 and 42 are formed over different fin structures, respectively. Similarly, although two fin structures 20 are illustrated in FIG. 1A, the number of fin structure per one gate structure is not limited to two, and may be one, or three or more.

The substrate 10 is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

The fin structures 20 may be formed by trench-etching the substrate. After forming the fin structures 20, the isolation insulating layer 30 is formed over the fin structures 20. The isolation insulating layer 30 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 30 over the fin structures 20, a planarization operation is performed, thereby removing part of the isolation insulating layer 30. The planarization operation may include a chemical mechanical polishing (CMP) and/or an etch-back process. Then, the isolation insulating layer 30 is further removed (recessed) so that the upper regions of the fin structures 20 are exposed.

Then, the dummy gate structures 40, 41 and 42 are formed over the exposed fin structures 20. The dummy gate structure includes a dummy gate electrode layer 44 made of poly silicon and a dummy gate dielectric layer 43. Sidewall spacers 48 including one or more layers of insulating materials are also formed on sidewalls of the dummy gate electrode layer. The sidewall spacers 48 include one or more layers of insulating material such as silicon nitride based material including SiN, SiON, SiCN and SiOCN. The film thickness of the sidewall spacers 48 at the bottom of the sidewall spacers is in a range from about 3 nm to about 15 nm in some embodiments, and is in a range from about 4 nm to about 8 nm in other embodiments.

The dummy gate structures further include a mask insulating layer 46, which is used to pattern a poly silicon layer into the dummy gate electrode layers. The thickness of the mask insulating layer 46 is in a range from about 10 nm to about 30 nm in some embodiment, and is in a range from about 15 nm to about 20 nm in other embodiments.

Figure 2:
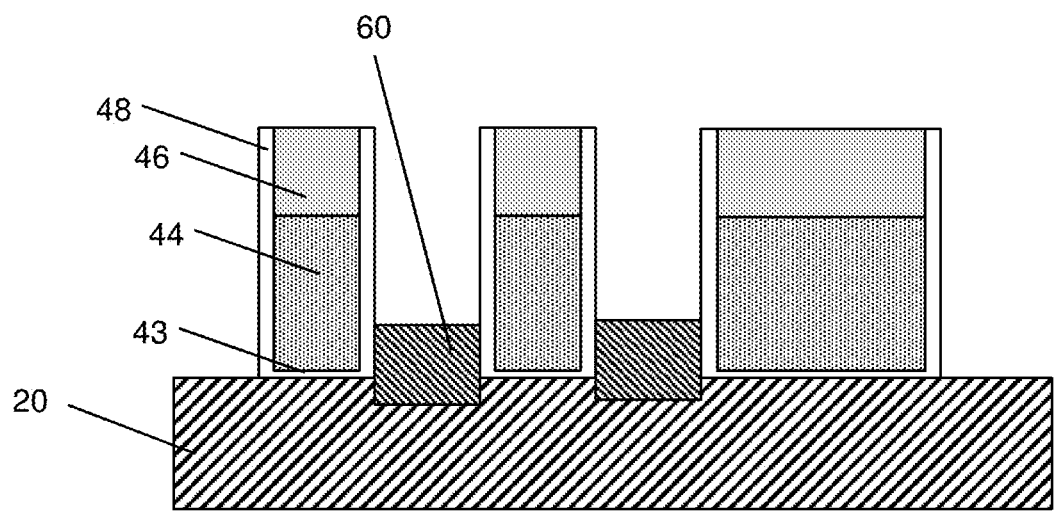
FIG. 2 shows a cross sectional view of one of the various stages of a sequential manufacturing process for a semiconductor device according to an embodiment of the present disclosure.

As shown in FIG. 2, after the dummy gate structures are formed, source/drain regions 60 are formed. In the present disclosure, a source and a drain are interchangeably used, and the term source/drain refers to either one of a source and a drain. In some embodiments, the fin structure 20 not covered by the dummy gate structures is recessed below the upper surface of the isolation insulating layer 30. Then, the source/drain regions 60 are formed over the recessed fin structure by using an epitaxial growth method. The source/drain regions 60 may include a strain material to apply stress to the channel region.

Figure 3:
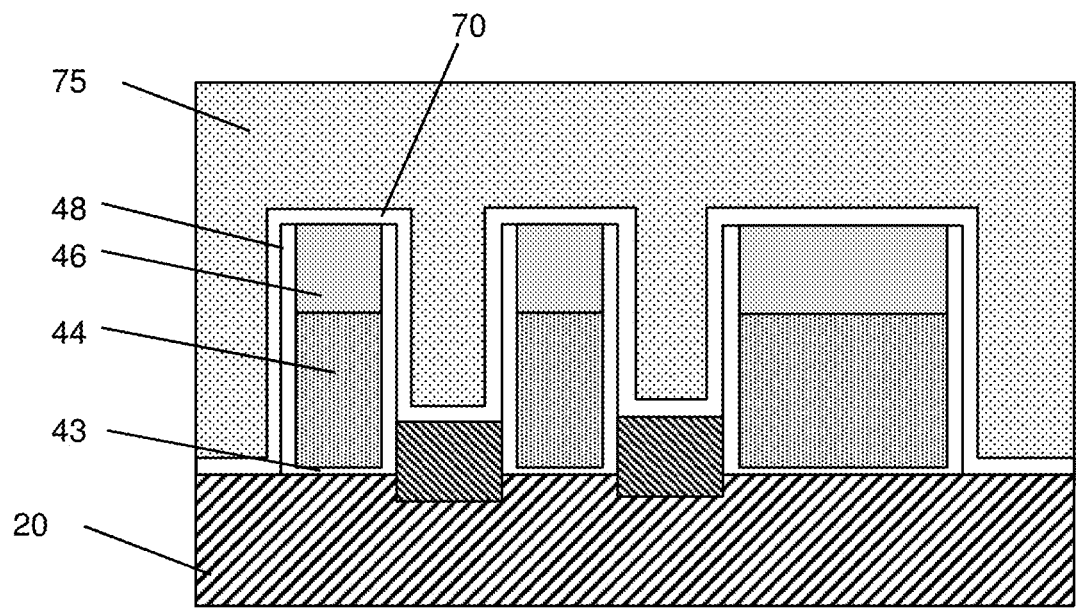
FIG. 3 shows a cross sectional view of one of the various stages of a sequential manufacturing process for a semiconductor device according to an embodiment of the present disclosure.

Then, as shown in FIG. 3, a first etching stop layer (ESL) 70 and a first interlayer insulating (ILD) layer 75 are formed over the dummy gate structures and the source/drain regions. The first ESL 70 includes one or more layers of insulating material such as silicon nitride based material including SiN, SiCN and SiOCN. The thickness of the first ESL 70 is in a range from about 3 nm to about 10 nm in some embodiments. The first ILD layer 75 includes one or more layers of insulating material such as silicon oxide based material such as silicon dioxide ($SiO_2$) and SiON.

Figure 4:
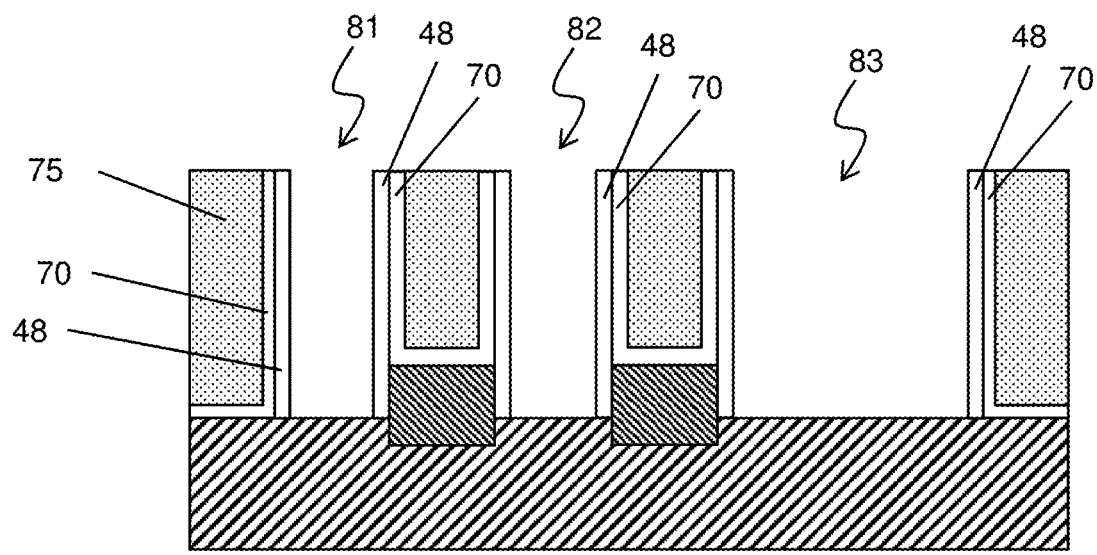
FIG. 4 shows a cross sectional view of one of the various stages of a sequential manufacturing process for a semiconductor device according to an embodiment of the present disclosure.

After a planarization operation on the first ILD layer 75 and the ESL 70, the dummy gate structures are removed, thereby making gate spaces 81, 82 and 83, as shown in FIG. 4. As shown in FIG. 4, the gate sidewall spacers 48 remain in the gate spaces.

Figure 5:
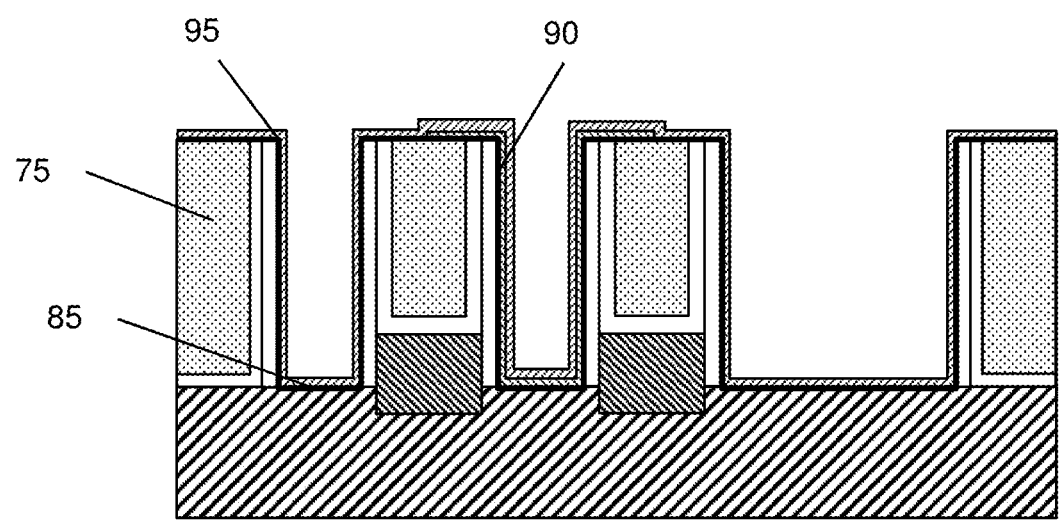
FIG. 5 shows a cross sectional view of one of the various stages of a sequential manufacturing process for a semiconductor device according to an embodiment of the present disclosure.

Then, as shown in FIG. 5, a gate dielectric layer 85 is formed. The gate dielectric layer 85 includes one or more layers of dielectric material, such as a high-k metal oxide. Examples of the metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer (not shown) made of, for example, silicon oxide, is formed over the fin structure (channel region) before forming the gate dielectric layer 85.

Further, a first work function adjustment (WFA) layer 90 for a p-channel FET is formed in the gate space 82. A blanket layer of a suitable conductive material is formed over the gate spaces and the first ILD layer 75, and a patterning operation including lithography and etching is performed to form the first WFA layer 90 for a p-channel FET in the gate space 82 (and the surrounding area). The first WFA layer 90 includes one or more layers of conductive material. Examples of the first WFA layer 90 for a p-channel FET include Ti, TiAlC, Al, TiAl, TaN, TaAlC, TiN, TiC and Co. In one embodiment, Ti is used. The thickness of the first WFA layer 90 is in a range from about 3 nm to about 10 nm in some embodiments. The first WFA layer 90 may be formed by chemical vapor deposition (CVD), physical vapor deposition (PVD) including sputtering, atomic layer deposition (ALD) or other suitable method. As shown in FIG. 5, the first WFA layer 90 is conformally formed in the gate space 82.

Then, a second WFA layer 95 for n-channel FETs is formed in the gate spaces 81 and 83. A blanket layer of a suitable conductive material is formed over the gate spaces and the first WFA layer 90, and a patterning operation including lithography and etching is performed to form the second WFA 95 for n-channel FETs in the gate spaces 81 and 83 (and the surrounding area). The second WFA layer 95 includes one or more layer of conductive material. Examples of the second WFA layer 95 for an n-channel FET include TiN, TaN, TaAlC, TiC, TaC, Co, Al, TiAl, HfTi, TiSi, TaSi or TiAlC. In one embodiment, TiN is used. The thickness of the second WFA layer 95 is in a range from about 3 nm to about 10 nm in some embodiments. The second WFA layer 95 may be formed by chemical vapor deposition (CVD), physical vapor deposition (PVD) including sputtering, atomic layer deposition (ALD) or other suitable methods. As shown in FIG. 5, the second WFA layer 95 is conformally formed in the gate spaces 81 and 83. It is noted that the order of forming the first WFA layer 90 and the second WFA layer 95 can be changed. The second WFA layer 95 is made of a different material than the first WFA layer 90.

Figure 6:
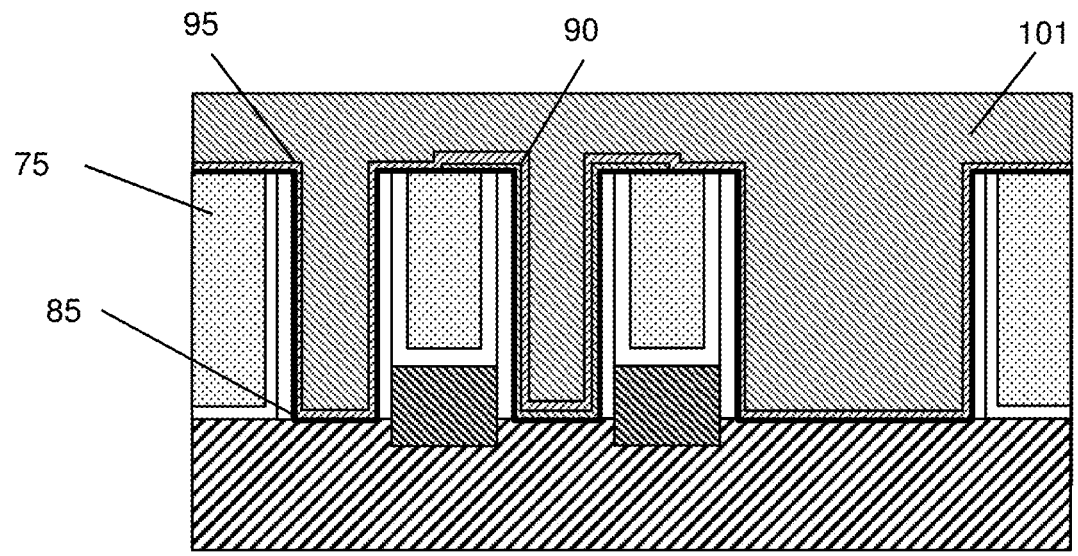
FIG. 6 shows a cross sectional view of one of the various stages of a sequential manufacturing process for a semiconductor device according to an embodiment of the present disclosure.

Then, as shown in FIG. 6, a first metal material 101 for a first metal layer 100 is formed over the structure of FIG. 5. The first metal material includes one or more layers of metal material, such as Al, Cu, W, Ti, Ta, TiN, TiAl, TiAlC, TiAlN, TaN, NiSi, CoSi, other conductive materials. In one embodiment, TiN is used. The first metal material is formed by CVD, PVD, ALD, electroplating or other suitable methods. The first metal layer 100 is made of a different material than at least one of the first WFA layer and the second WFA layer.

Figure 7:
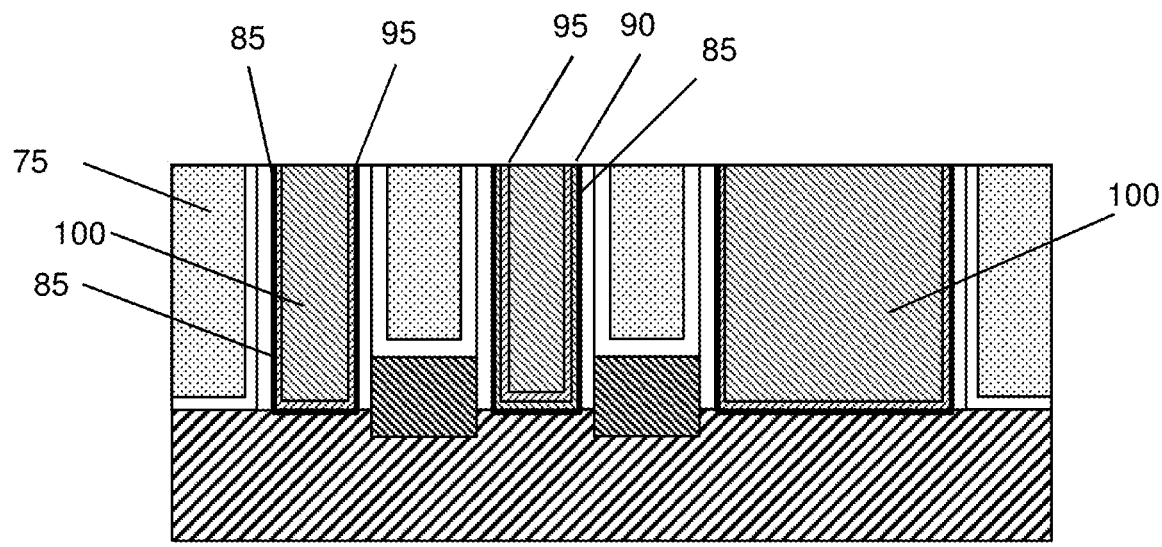
FIG. 7 shows a cross sectional view of one of the various stages of a sequential manufacturing process for a semiconductor device according to an embodiment of the present disclosure.

Then, as shown in FIG. 7, a planarization operation is performed, thereby removing the upper portion of the deposited first metal material 101. After the planarization operation, the first metal layer 100 is formed in each of the gate spaces. The planarization operation may include a chemical mechanical polishing (CMP) and/or an etch-back process.

Figure 8:
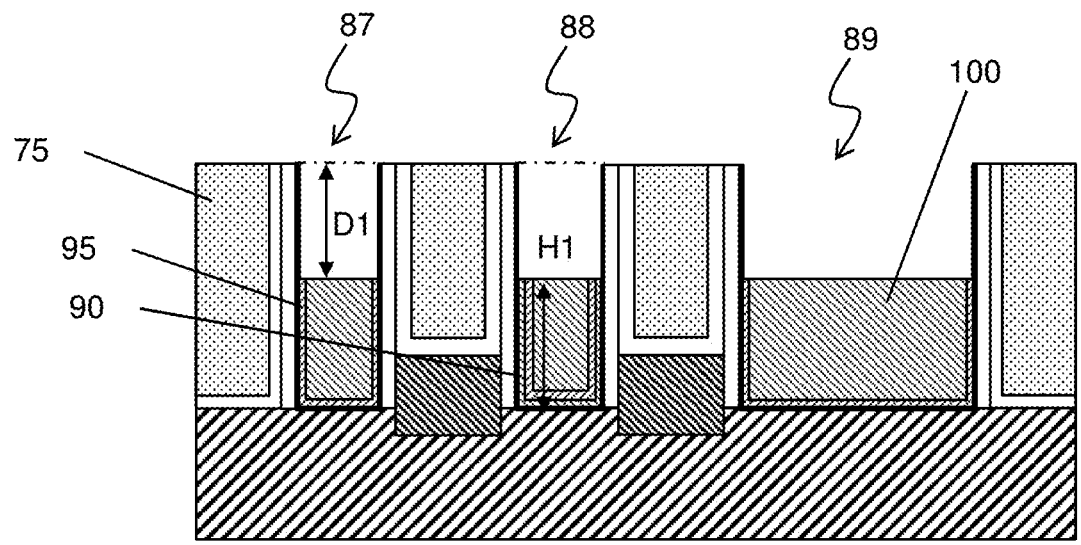
FIG. 8 shows a cross sectional view of one of the various stages of a sequential manufacturing process for a semiconductor device according to an embodiment of the present disclosure.

After each of the gate spaces are filled with the first metal layer 100, the first metal layers 100 are recessed (etched-back) to form gate recesses 87, 88 and 89, as shown in FIG. 8. The upper portions of the first metal layers 100 are etched by using dry etching and/or wet etching. The amount (depth) D1 of the recessed portion is in a range from about 20 nm to about 50 nm in some embodiments, and the height H1 of the remaining first metal layer from the surface of the fin structure 20 is in a range from about 30 nm to about 60 nm in some embodiments.

During the recess etching, the first WFA layer 90 and the second WFA layer 95 are also etched.

Figure 9:
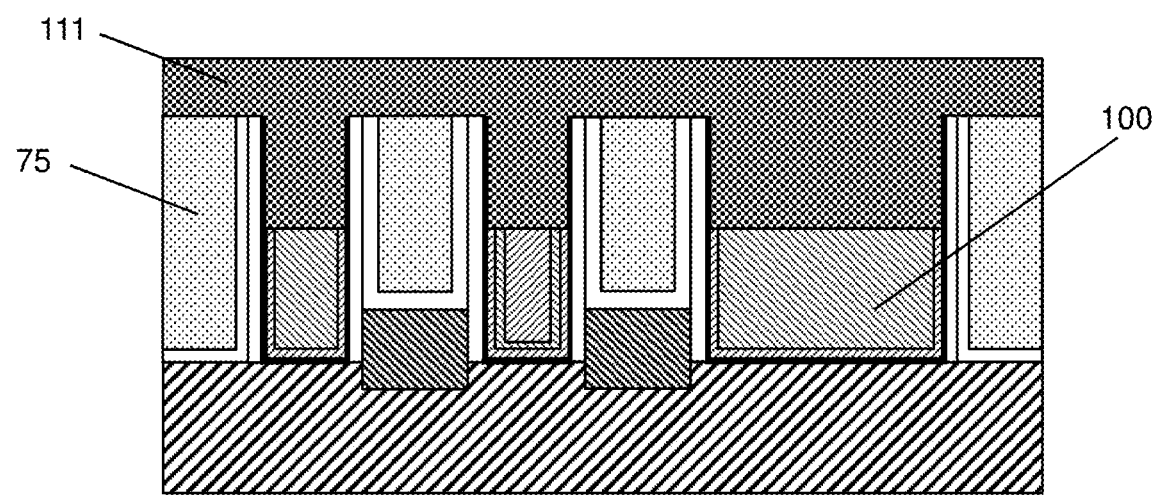
FIG. 9 shows a cross sectional view of one of the various stages of a sequential manufacturing process for a semiconductor device according to an embodiment of the present disclosure.

Then, as shown in FIG. 9, a second metal material 111 for a second metal layer 110 is formed over the structure of FIG. 8. The second metal material includes one or more layers of metal material, such as Al, Cu, Co, W, Ti, Ta, TiN, TiAl, TiAlC, TiAlN, TaN, NiSi, CoSi, other conductive materials. In one embodiment, W or Co is used. The second metal material is formed by CVD, PVD, ALD, electroplating or other suitable methods. The second metal material 111 is made of a different material than the first metal material (and the first and second WFA layers) and has a higher durability against a gas containing Cl and/or F than the first metal material 101 (and the first and second WFA layers).

A planarization operation is subsequently performed, thereby removing the upper portion of the deposited second metal material 111. After the planarization operation, the second metal layer 110 is formed in each of the gate spaces. The planarization operation may include a chemical mechanical polishing (CMP) and/or an etch-back process.

Figure 10:
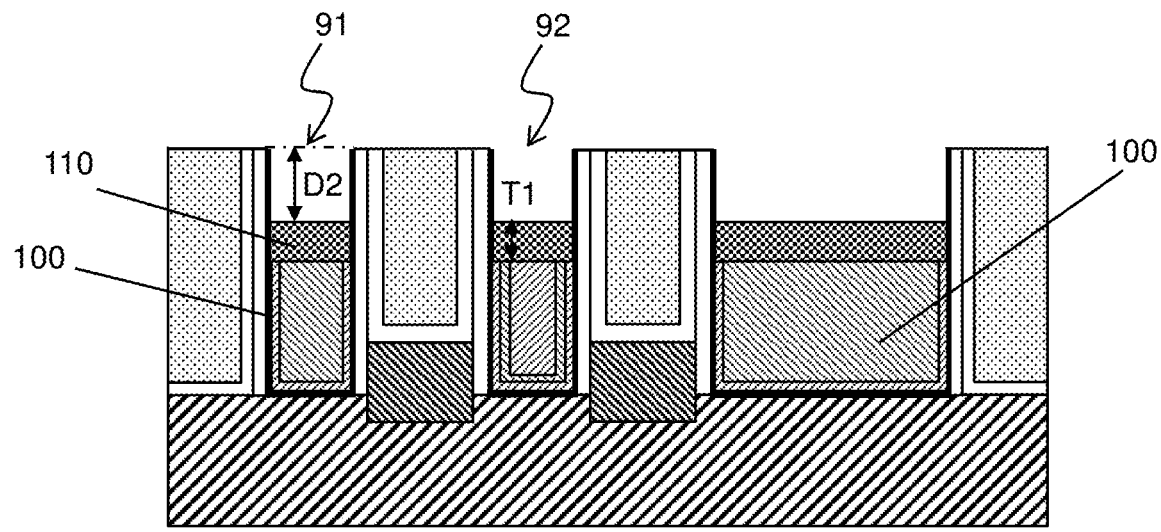
FIG. 10 shows a cross sectional view of one of the various stages of a sequential manufacturing process for a semiconductor device according to an embodiment of the present disclosure.

The planarized second metal layers 110 are further recessed in the gate spaces by using an etch-back operation, as shown in FIG. 10. The amount (depth) D2 of the recessed portion is in a range from about 10 nm to about 40 nm in some embodiments, and the thickness T1 of the remaining second metal layer 110 from the upper surface of the first metal layer 100 is in a range from about 10 nm to about 30 nm in some embodiments. As shown in FIG. 10, a bottom of the second metal layer 110 is in contact with an upper surface of the first metal layer 100 and an upper surface of the first and/or second WFA layers 90, 95.

Figure 11:
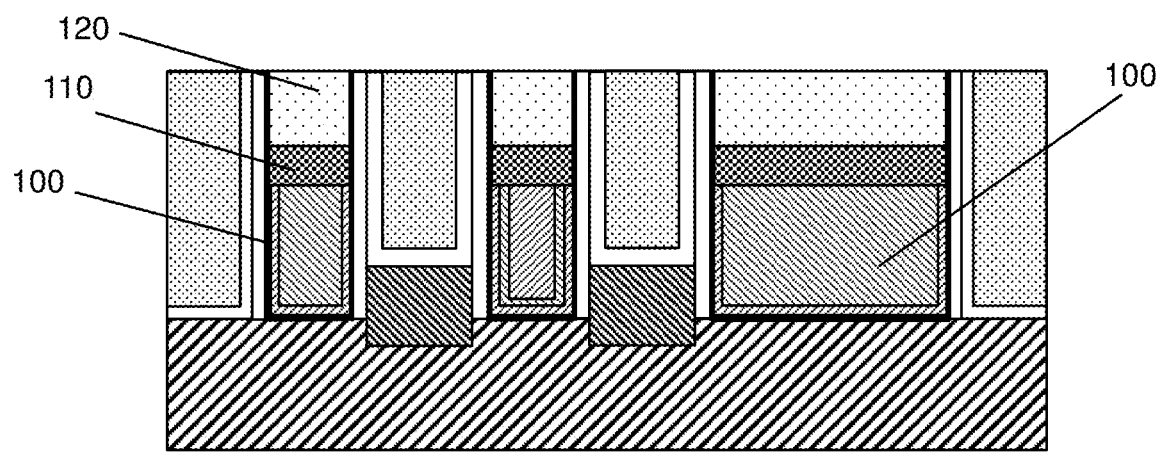
FIG. 11 shows a cross sectional view of one of the various stages of a sequential manufacturing process for a semiconductor device according to an embodiment of the present disclosure.

Then, as shown in FIG. 11, cap insulating layers 120 are formed over the second metal layers 110. The cap insulating layer 120 includes one or more layers of insulating material such as silicon nitride based material including SiN, SiCN and SiOCN.

To form the cap insulating layers 120, a blanket layer of an insulating material having a relatively large thickness is formed over structure of FIG. 10, and a planarization operation, such as a CMP, is performed.

Figure 12:
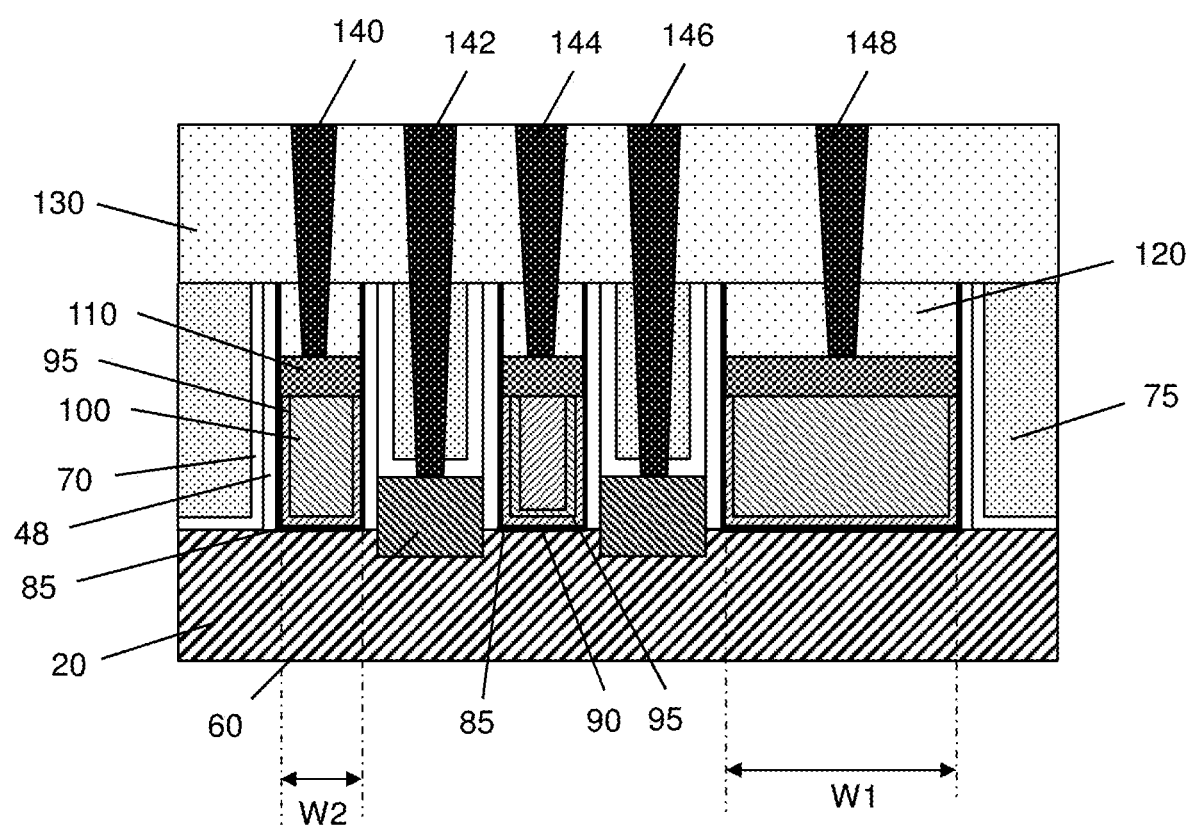
FIG. 12 shows a cross sectional view of one of the various stages of a sequential manufacturing process for a semiconductor device according to an embodiment of the present disclosure.

Then, a second ILD 130 is formed over the structure of FIG. 11, and a patterning operation is performed to form via holes. The via holes are filed with one or more conductive materials, thereby forming via plugs 140, 142, 144, 146 and 148, as shown in FIG. 12. As shown in FIG. 12, a width W1 along the X direction (a second lateral direction perpendicular to the first lateral direction) of the wide gate electrode is greater than a width W2 along the X direction of the narrow gate electrode. Further, one or more metal wirings (not shown) are formed over the via plugs, respectively. A dual damascene method may be used to form the via plugs and the metal wirings.

In the above embodiment, the second metal layers are formed by using a blanket deposition, a planarization operation and an etch-back operation. In another embodiment, the second metal layers are directly formed over the first metal layers. For example, after the structure of FIG. 8 is formed, a selective deposition of W or Co is used to form the second metal layer over the first metal layers only in the gate spaces, to obtain the structure shown in FIG. 10. For example, by using an ALD method, Co and W can be selectively grown on the metal layers 90, 95 and 100, while Co or W are not grown on $SiO_2$, SiN or other dielectric materials.

It is understood that the device shown in FIG. 12 undergoes further CMOS processes to form various features such as interconnect metal layers, dielectric layers, passivation layers, etc. In the above embodiment, the manufacturing operations for a Fin FET are described. However, the above manufacturing process may be applied to other types of FET, such as a planar type FET.

The various embodiments or examples described herein offer several advantages over the existing art. For example, in the present disclosure, as shown in FIG. 12, the via plugs 140, 144 and 148 are in contact with the second metal layers 110. When via holes for the via plugs 140, 144 and 148 are formed, a dry etching using a gas containing Cl and/or F is used. If the second metal layers 110, which have a higher durability against Cl or F, are not used, the Ti or TiN layer exposed in the bottoms of the contact holes would be damaged (e.g., causing erosion) by the Cl or F component in the etching gas. In contrast, in the present embodiment, since the second metal layers 110, which have a higher durability against Cl or F that Ti and TiN, are used, damage to the Ti or TiN layers can be avoided.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a dummy gate structure is formed over a substrate. A source/drain region is formed. A first insulating layer is formed over the dummy gate structure and the source/drain region. A gate space is formed by removing the dummy gate structure. The gate space is filled with a first metal layer. A gate recess is formed by removing an upper portion of the filled first metal layer. A second metal layer is formed over the first metal layer in the gate recess. A second insulating layer is formed over the second metal layer in the gate recess.

According to another aspect of the present disclosure, in a method of manufacturing a semiconductor device, a first dummy gate structure and a second dummy gate structure are formed over a substrate. Source/drain regions are formed. A first insulating layer is formed over the first and second dummy gate structures and the source/drain regions. A first gate space and a second gate space are formed by removing the first and second dummy gate structures, respectively. A first metal layer is formed in the first gate space, and a second metal layer is formed in the first and second gate spaces. After forming the first and second metal layers, the first and second gate spaces are filled with a third metal layer. A gate recess is formed by removing upper portions of the first, second and third metal layers formed in the first gate space, and a second gate recess is formed by removing upper portions of the first and third metal layers formed in the second gate space. A first gate electrode and a second gate electrode are formed by forming metal layers in the first and second gate recesses. Second insulating layers are formed over the fourth metal layers in the first and second gate recess.

In accordance with yet another aspect of the present disclosure, a semiconductor device includes a first field effect transistor (FET) including a first gate dielectric layer and a first gate electrode. The first gate electrode includes a first lower metal layer and a first upper metal layer. The first lower metal layer includes a first underlying metal layer in contact with the first gate dielectric layer and a first bulk metal layer. A bottom of the first upper metal layer is in contact with an upper surface of the first underlying metal layer and an upper surface of the first bulk metal layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first field effect transistor (FET) including a first gate dielectric layer and a first gate electrode, wherein:
   the first gate electrode includes a first lower metal layer and a first upper metal layer,
   the first lower metal layer includes a first underlying metal layer in contact with the first gate dielectric layer and a first bulk metal layer fully filling a space formed by the first underlying metal layer,
   the first underlying metal layer consists of one conductive layer containing at least Ti and Al,
   the first bulk metal layer consists of TiN, and
   a bottom of the first upper metal layer is in contact with an upper surface of the first underlying metal layer and an upper surface of the first bulk metal layer.

2. The semiconductor device of claim 1, wherein the first upper metal layer includes at least one of Co, W, Ti, Al, and Cu.

3. The semiconductor device of claim 1, wherein the first upper metal layer includes Co.

4. The semiconductor device of claim 1, further comprising a cap insulating layer disposed on the first gate electrode.

5. The semiconductor device of claim 4, further comprising sidewall spacers disposed on opposing side faces of the first gate electrode and the cap insulating layer.

6. The semiconductor device of claim 5, further comprising:
   an interlayer dielectric (ILD) layer and an etching stop layer disposed between the interlayer dielectric layer and one of the sidewall spacers.

7. The semiconductor device of claim 6, the etching stop layer is one of SiN, SiCN and SiOCN.

8. The semiconductor device of claim 6, further comprising a source/drain epitaxial layer in contact with one of the sidewall spacers,
   wherein the etching stop layer is in contact with an upper surface of the source/drain epitaxial layer.

9. The semiconductor device of claim 8, further comprising a source/drain contact passing through the ILD layer and the etching stop layer and in contact with the source/drain epitaxial layer.

10. The semiconductor device of claim 8, further comprising a gate contact passing through the cap insulating layer and in contact with the first upper metal layer.

11. The semiconductor device of claim 1, further comprising:
    a second FET including a second gate dielectric layer and a second gate electrode, wherein:
    the second gate electrode includes a second lower metal layer and a second upper metal layer,
    the second lower metal layer includes a second underlying metal layer in contact with the second gate dielectric layer, a third underlying metal layer and a second bulk metal layer fully filing a space formed by the third underlying metal layer,
    the second underlying metal layer consists of TiN,
    the third underlying metal layer consists of one selected from the group consisting of TiAl, TiAlC and TaAlC,
    the second bulk metal layer consists of TiN, and
    a bottom of the second upper metal layer is in contact with an upper surface of the second underlying metal layer, an upper surface of the third underlying metal layer and an upper surface of the second bulk metal layer.

12. The semiconductor device of claim 1, further comprising:
    a second field effect transistor (FET) including a second gate dielectric layer and a second gate electrode, wherein:
    the second gate electrode includes a second lower metal layer and a second upper metal layer,
    the second lower metal layer includes a second underlying metal layer in contact with the second gate dielectric layer and a second bulk metal layer fully filling a space formed by the second underlying metal layer,
    the second underlying metal layer consists of one selected from the group consisting of TiAl, TiAlC and TaAlC,
    the second bulk metal layer consists of TiN,
    a bottom of the second upper metal layer is in contact with an upper surface of the second underlying metal layer and an upper surface of the second bulk metal layer, and
    a width of the second gate electrode is greater than a width of the first gate electrode, along a lateral direction perpendicular to a lateral direction in which the first and second gate electrodes extend.

13. A semiconductor device, comprising:
    an FET including a gate dielectric layer, a gate electrode and a source/drain epitaxial layer, wherein:

an interlayer dielectric (ILD) layer is disposed over the gate electrode and the source/drain epitaxial layer, a source/drain contact passing through the ILD layer and in contact with the source/drain epitaxial layer is provided, a gate contact passing through a cap insulating layer and in contact with the gate electrode is provided, the gate electrode includes a lower metal layer and an upper metal layer, the lower metal layer includes a first underlying metal layer in contact with the gate dielectric layer, a second underlying metal layer and a bulk metal layer fully filing a space formed by the second underlying metal layer, the first underlying metal layer consists of TiN, the second underlying metal layer consists of TiAl or TaAlC, the bulk metal layer consists of TiN, and a bottom of the upper metal layer is in contact with an upper surface of the first underlying metal layer, an upper surface of the second underlying metal layer and an upper surface of the bulk metal layer.

14. The semiconductor device of claim 13, wherein the upper metal layer includes at least one of Co, W, Ti, Al, and Cu.

15. The semiconductor device of claim 13, further comprising:
a cap insulating layer disposed on the gate electrode; and
sidewall spacers disposed on opposing side faces of the gate electrode and the cap insulating layer.

16. The semiconductor device of claim 15, wherein the second underlying metal layer consists of TiAl.

17. The semiconductor device of claim 16, further comprising an etching stop layer disposed below the ILD layer, wherein the etching stop layer is one of SiCN and SiOCN.

18. The semiconductor device of claim 17, further comprising a source/drain epitaxial layer in contact with one of the sidewall spacers, wherein the etching stop layer is in contact with an upper surface of the source/drain epitaxial layer.

19. A semiconductor device, comprising:
a first FET including a first gate dielectric layer and a first gate electrode; and
a second FET including a second gate dielectric layer and a second gate electrode, wherein:
a gate length of the first FET is smaller than a gate length of the second FET,
the first gate electrode includes a first lower metal layer and a first upper metal layer,
the first lower metal layers includes a first underlying metal layer in contact with the first gate dielectric layer, a second underlying metal layer disposed on the first underlying metal layer and a first bulk metal layer fully filing a space formed by the second underlying metal layer,
the second gate electrode includes a second lower metal layer and a second upper metal layer,
the second lower metal layer includes a third underlying metal layer in contact with the second gate dielectric layer and a second bulk metal layer fully filling a space formed by the third underlying metal layer,
the first underlying metal layer consists of TiN,
the second underlying metal layer consists of one selected from the group consisting of TiAl, TiAlC and TaAlC,
the first bulk metal layer consists of TiN,
the third underlying metal layer consists of one selected from the group consisting of TiAl, TiAlC and TaAlC, and
the second bulk metal layer consists of TiN.

20. The semiconductor device of claim 19, wherein:
the first gate electrode consists of the first underlying metal layer, the second underlying metal layer, the first bulk metal layer and the first upper metal layer, and
the second gate electrode consist of the third underlying metal layer, the second bulk metal layer and the second upper metal layer.

* * * * *